United States Patent
Hokoiwa et al.

(10) Patent No.: US 7,400,160 B2
(45) Date of Patent: Jul. 15, 2008

(54) SEMICONDUCTOR INTEGRATED CIRCUIT DEVICE, MEASUREMENT METHOD THEREFORE AND MEASUREMENT SYSTEM FOR MEASURING AC CHARACTERISTICS THEREOF

(75) Inventors: Naho Hokoiwa, Kanagawa (JP); Yasutaka Uenishi, Kanagawa (JP)

(73) Assignee: NEC Electronics Corporation, Kawasaki, Kanagawa (JP)

( * ) Notice: Subject to any disclaimer, the term of this patent is extended or adjusted under 35 U.S.C. 154(b) by 0 days.

(21) Appl. No.: 11/730,508

(22) Filed: Apr. 2, 2007

(65) Prior Publication Data
US 2007/0252583 A1 Nov. 1, 2007

(30) Foreign Application Priority Data
Apr. 3, 2006 (JP) ............................. 2006-102082

(51) Int. Cl.
G01R 31/02 (2006.01)
G01R 31/26 (2006.01)
G01R 31/28 (2006.01)
G04F 8/00 (2006.01)

(52) U.S. Cl. ..................... 324/763; 324/765; 368/118; 714/731

(58) Field of Classification Search ................ 324/763, 324/765; 368/118; 714/731
See application file for complete search history.

(56) References Cited

U.S. PATENT DOCUMENTS

| | | | | |
|---|---|---|---|---|
| 5,083,299 A | * | 1/1992 | Schwanke et al. ........... 368/113 |
| 6,005,829 A | * | 12/1999 | Conn ......................... 368/118 |
| 6,075,418 A | * | 6/2000 | Kingsley et al. ............... 331/57 |
| 6,233,205 B1 | * | 5/2001 | Wells et al. .................. 368/118 |
| 6,430,720 B1 | * | 8/2002 | Frey et al. .................... 714/744 |
| 6,466,520 B1 | * | 10/2002 | Speyer et al. ............... 368/118 |
| 2003/0193843 A1 | * | 10/2003 | Krahe et al. ................. 368/113 |

FOREIGN PATENT DOCUMENTS

JP 7-84000 3/1995

* cited by examiner

*Primary Examiner*—Ha Nguyen
*Assistant Examiner*—Karen M Kusumakar
(74) *Attorney, Agent, or Firm*—McGinn IP Law Group, PLLC

(57) ABSTRACT

Disclosed is an AC characteristics measurement system that includes a flip-flop arranged in a loop of a ring oscillator; a clock generating circuit that receives a signal propagated in said loop of said ring oscillator and generates a clock signal to be supplied to said flip-flop; a delay adjustment circuit that receives a signal propagated in said loop of said ring oscillator and generates a data signal to be supplied to said flip-flop and that receives a control signal and variably controls the time difference between a transition edge of said data signal to be supplied to said flip-flop and an effective edge of said clock signal to be supplied to said flip-flop, based on said control signal; and a setup-hold changeover circuit that is provided at a preceding stage of said flip-flop and that switches the temporal before and after relation between a transition edge of said data signal supplied to said flip-flop and an effective edge of said clock signal, responsive to a control signal for performing changeover between the measurements of setup time and hold time. An AC measured value is derived from the value of the control signal at a time point of cessation of oscillation of a preset node of the loop.

13 Claims, 10 Drawing Sheets

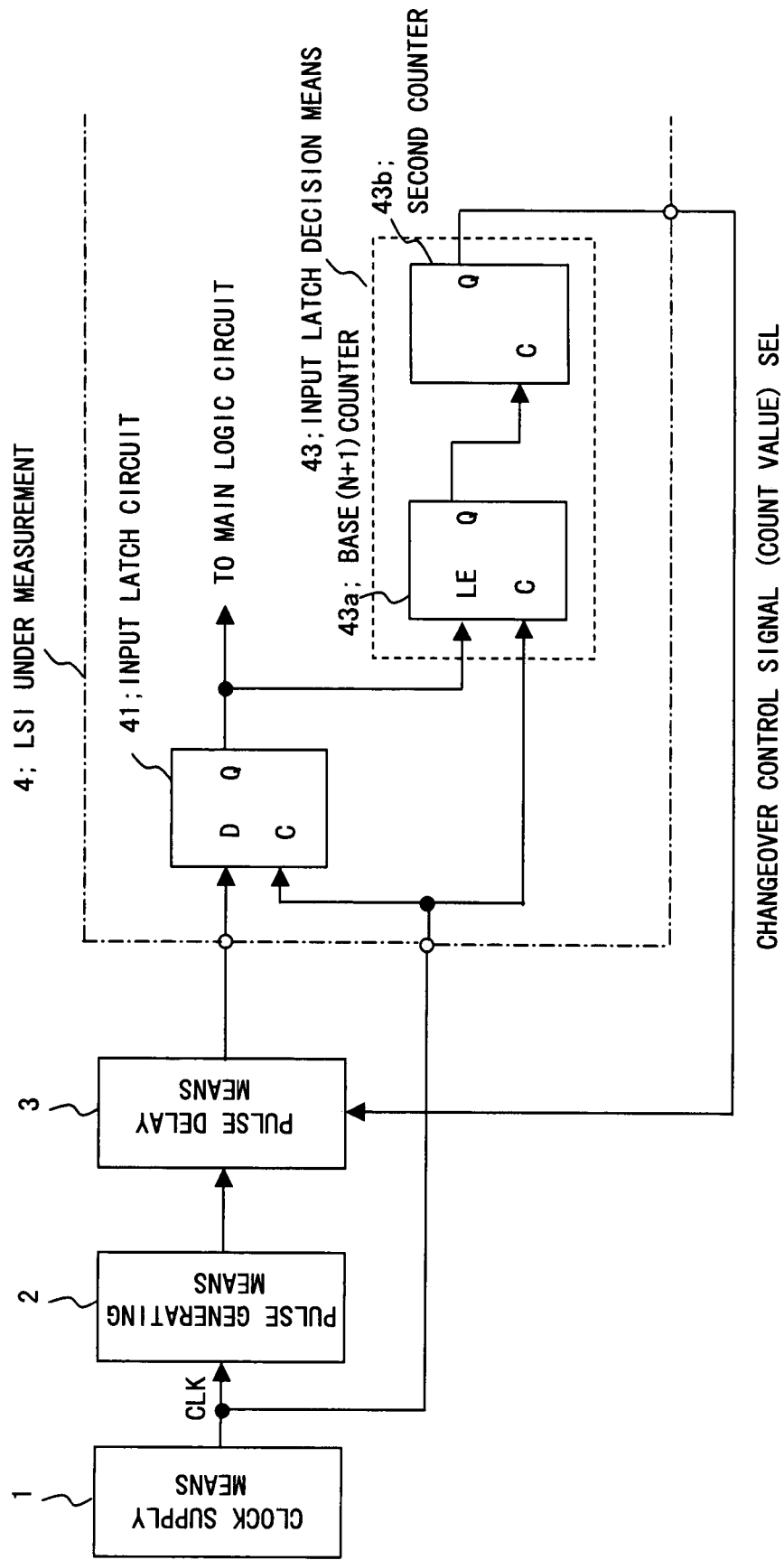

SEMICONDUCTOR INTEGRATED CIRCUIT DEVICE, MEASUREMENT METHOD THEREFORE AND MEASUREMENT SYSTEM FOR MEASURING AC CHARACTERISTICS THEREOF

FIELD OF THE INVENTION

This invention relates to a technique for measuring AC characteristics of an LSI (Large Scale Integrated Circuit). More particularly, this invention relates to a system for measuring a setup time and hold time of a digital LSI, a semiconductor integrated circuit device, and a method for measurement thereof

BACKGROUND OF THE INVENTION

In a digital LSI having a latch or flip-flop that samples data responsive to a clock signal, it is necessary for the setup time and hold time to be within preset time widths in order for the data to be sampled correctly by the latch or flip-flop. Prescribed values relating the setup time and hold time of a latch or flip-flop need to be taken into account in the design of an LSI. The setup time is the time interval during which a data signal to be sampled by a latch, for example, needs to be kept stabilized before the timing of an effective edge, such as a rising edge, of the clock. The hold time is the time interval during which the data signal must be retained as from the effective edge of the clock. Meanwhile, the setup time and hold time of the latch or flip-flop is prescribed with a margin to have time ranges larger than actual ones and the operation range of the latch or flip-flop is set so that the operation speed will be lowered than that corresponding to the actual performance of the latch or flip-flop.

It is necessary to measure the setup time and hold time of e.g. the latch and to suitably decide the time range to be met in the design of an LSI. Accordingly, it is desired that whether or not e.g. a latch meets the requirements for setup time and hold time can be measured with ease and more comprehensively.

As a system for measuring AC characteristics of an LSI, in particular a system for measuring the setup time and the hold time of a digital LSI, reference is made to Patent Document 1, as an example. FIG. 10 shows the configuration of a system disclosed in this Patent Document 1. Referring to FIG. 10, the system includes, outside an LSI 4 under measurement, a clock supply means 1, for supplying a clock signal CLK, a pulse generating means 2, and a pulse delaying means 3. The pulse generating means 2 repeatedly generates pulses for measurement, each of a preset pulse width, in synchronization with the clock signal. The pulse delaying means 3 operates for delaying the pulse for measurement to supply the so delayed pulse to the LSI 4 under measurement. The pulse delaying means 3 also operates for changing the amount of delay, at each repetition of the pulses for measurement, based on a changeover control signal, in a direction of decreasing the phase difference of the clock signal as compared to that at the previous repetition. There is provided, within the LSI 4 under measurement, an input latch decision means 43 for deciding whether or not an input latch circuit 41 as a device under measurement has correctly taken in the pulse for measurement, for each repetition of the pulse for measurement, and for outputting a changeover control signal for varying the amount of delay as long as the pulse for measurement is taken in correctly.

[Patent Document 1]
Japanese Patent Kokai Publication No. JP-A-7-84000

SUMMARY OF THE DISCLOSURE

However, in the configuration shown in FIG. 10, it is necessary to provide the clock supply means 1, which generates a clock signal, outside the LSI 4 under measurement. It is also necessary to provide the pulse generating means (circuit) 2 for repeatedly generating pulses for measurement, each of a preset pulse width, in synchronization with the clock signal. Hence, the AC characteristics cannot be measured with ease. The aforementioned Patent Document 1 also discloses a configuration distinct from that shown in FIG. 10. In the disclosed configuration, the pulse generating circuit 2 is provided within the LSI 4 under measurement to enable facilitated measurement of AC characteristics without the necessity of providing an outside pulse generating circuit. However, in this case, the clock generating means needs to be provided outside the LSI 4 under measurement.

Moreover, if the clock supply means and the pulse generating means are provided outside the LSI 4 under measurement, there may be cases where e.g. an connection interface with outside affects measurement accuracy, such that, if in particular the LSI 4 under measurement operates at a higher operating frequency, it is not possible to correctly measure the AC characteristics.

The invention disclosed in the present application may be summarized substantially as follows:

In one aspect, the present invention provides an AC characteristics measurement circuit system comprising:

a ring oscillator that includes odd number of stages of inverters arranged in a ring;

a circuit under measurement that samples an input signal responsive to a clock signal, AC characteristics of which are to be measured, said circuit under measurement being inserted in a loop of said ring oscillator;

a clock generating circuit that receives a signal propagated in said loop of said ring oscillator and generates a clock signal to be supplied to said circuit under measurement; and a delay adjustment circuit that receives a signal propagated in said loop of said ring oscillator and generates said input signal to be supplied to said circuit under measurement, said delay adjustment circuit receiving a control signal and variably controlling the delay amount of said input signal supplied to said circuit under measurement, based on said control signal.

In the present invention, said clock generating circuit generates the clock signal to be supplied to said circuit under measurement, responsive to transition of the output signal of the inverter arranged at the preceding stage of said circuit under measurement; and said delay adjustment circuit receives an output signal of the inverter at a preceding stage of said circuit under measurement and varies the delay time of said input signal based on said control signal. An output signal of the circuit under measurement is supplied to an input end of a succeeding stage inverter of the circuit under measurement.

In the present invention, the clock generating circuit and the delay adjustment circuit are mounted on a chip on which the circuit under measurement is mounted.

According to the present invention, the setup time and/or the hold time of the circuit under measurement are derived from the value of the control signal at a time point of cessation of oscillation of a preset node of the ring oscillator.

In another aspect, the present invention provides an AC characteristics measurement system comprising:

a ring oscillator that includes odd number of stages of inverters arranged in a ring;

a flip-flop arranged in a loop of said ring oscillator;

a clock generating circuit that receives a signal propagated in said loop and generates a clock signal to be supplied to said flip-flop; and a delay adjustment circuit that receives a signal propagated in said loop and generates a data signal to be supplied to said flip-flop and that variably controls, based on a control signal, the time difference between a transition edge of said data signal to be supplied to said flip-flop and an effective edge of said clock signal to be supplied to said flip-flop.

In the present invention, the setup time and/or the hold time of the flip-flop is derived from the value of the control signal at a time point of cessation of oscillation at a preset node of the ring oscillator.

In the present invention, the clock generating circuit generates the clock signal to be supplied to the flip-flop responsive to transition of an output signal of the inverter at a preceding stage of the flip-flop. The delay adjustment circuit receives an output signal of the inverter of the preceding stage of the flip-flop to vary the delay time of the data signal based on the control signal. An output signal of the flip-flop is supplied to an input end of the inverter at the succeeding stage of the flip-flop.

The system according to the present invention also includes a setup-hold changeover circuit that is provided at a preceding stage of said flip-flop and that switches the temporal before and after relation between a transition edge of said data signal supplied to said flip-flop and an effective edge of said clock signal, responsive to a control signal for performing changeover between the measurements of setup time and hold time.

In the present invention, a circuit for generating an oscillation control signal for controlling the start of oscillation of the ring oscillator is provided in the loop of the ring oscillator. The flip-flop is reset by a reset signal entered from outside to reset oscillation of the ring oscillator. The ring oscillator again starts oscillation when the oscillation control signal is set to a value indicating oscillation.

In the present invention, the system for measuring AC characteristics is mounted on a chip on which the flip-flop is mounted.

The AC characteristics measurement system according to the present invention may be mounted on a chip different than a chip on which the flip-flop is mounted.

In yet another aspect, the present invention provides a method for measuring a semiconductor device in which a flip-flop, AC characteristics of which are to be measured, is arranged in a loop of a ring oscillator made up of an odd number of stages of inverters connected in a ring. The method includes steps of:

supplying to the flip-flop a data signal and a clock signal generated from a signal propagated in the loop; and variably controlling, based on a control signal, the time difference between a transition edge of the data signal to be supplied to the flip-flop and an effective edge of the clock signal to be supplied to the flip-flop. A measured value of AC characteristics is derived from a value of the control signal at a time point of cessation of oscillation of a preset node of the loop.

The meritorious effects of the present invention are summarized as follows.

According to the present invention, the setup time and hold time may be determined based on the cessation of oscillation of a ring oscillator, so that measurement may be simplified. That is, according to the present invention, a circuit under measurement such as a flip-flop, AC characteristics of which are to be measured, is inserted into a loop of the ring oscillator. From a signal propagated in the ring oscillator, data and clock to be supplied to the circuit under measurement are generated. The phase difference between the data and clock is variably set by a control signal. If the setup time and hold time of the circuit under measurement meet a specified design condition, the oscillation of the ring oscillator is sustained. If the setup time and hold time of the circuit under measurement fails to meet the specified design condition, the oscillation of the ring oscillator comes to a stop. The timing of the cessation of oscillation of the ring oscillator may be observed as indicating the smallest values of the setup time and hold time.

With the ring oscillator configuration of the present invention, the clock and measurement pulse may autonomously be generated to measure the setup time and hold time so that it is unnecessary to apply the clock from outside.

According to the present invention, it is unnecessary to provide a clock supply circuit, pulse generating circuit or pulse delay circuit outside of the system for measurement, thus simplifying measurement and contributing to improvement of measurement accuracy.

Still other features and advantages of the present invention will become readily apparent to those skilled in this art from the following detailed description in conjunction with the accompanying drawings wherein examples of the invention are shown and described, simply by way of illustration of the mode contemplated of carrying out this invention. As will be realized, the invention is capable of other and different examples, and its several details are capable of modifications in various obvious respects, all without departing from the invention. Accordingly, the drawing and description are to be regarded as illustrative in nature, and not as restrictive.

BRIEF DESCRIPTION OF THE DRAWINGS

FIG. 10 is a block diagram showing the configuration of a system for measurement of AC characteristics of an LSI of Patent Document 1.

EXAMPLES OF THE INVENTION

Figure 1:
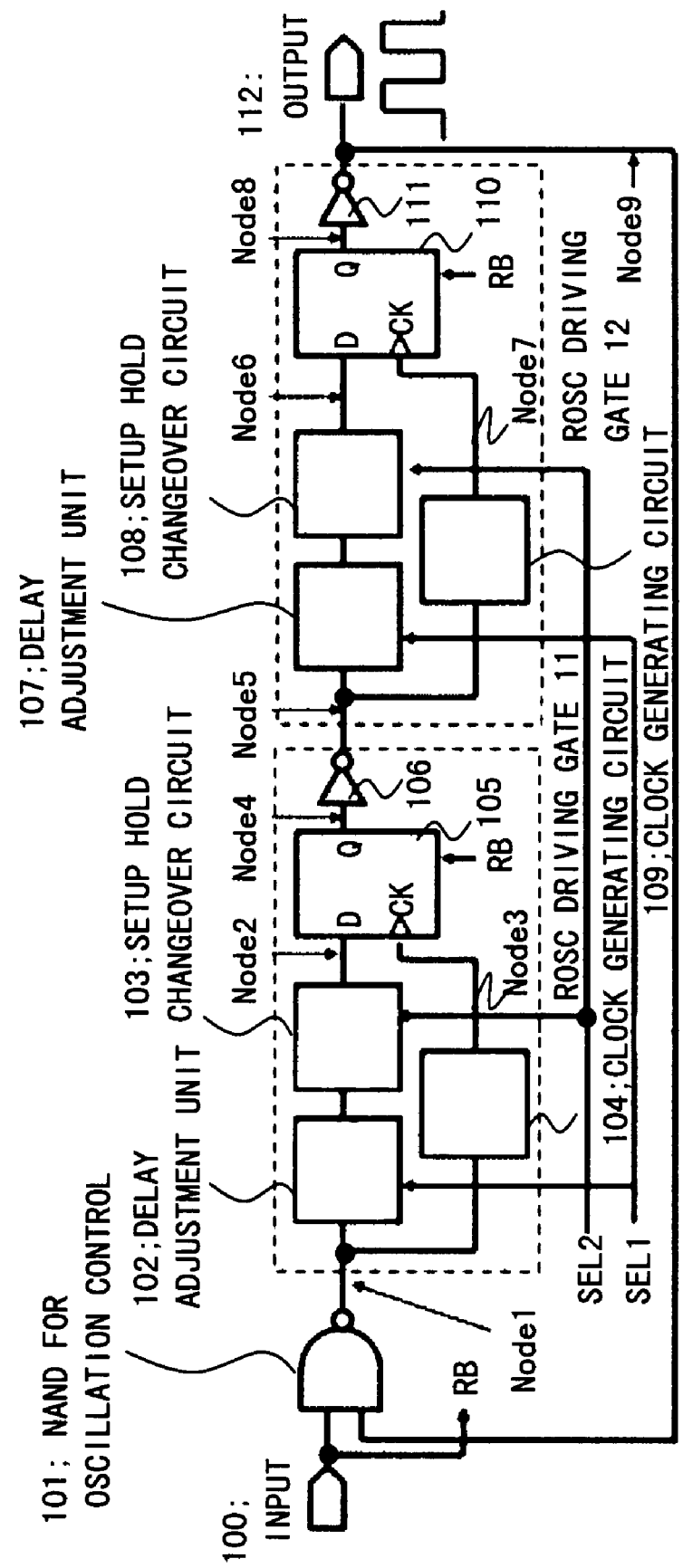
FIG. 1 is a block circuit diagram schematically showing the circuit configuration of an example of the present invention.

The present invention will now be described with reference to the drawings. The operation principle of the present invention will be described first, and then examples will be described. A circuit having a latch or flip-flop which samples input data responsive to a clock signal, AC characteristics of which are to be measured is termed a circuit under measurement. The circuit under measurement (e.g. each flip-flops 105 and 110 in FIG. 1), is inserted into a loop of a ring oscillator, composed by odd stages of inverters connected in a ring. In the present invention, the AC characteristics of the circuit under measurement may be decided based on cessation of oscillation of the ring oscillator.

More specifically, in the present invention, a data signal and a clock signal, each of which is generated by a signal propagated through a loop of the ring oscillator, are supplied to a circuit under measurement (each flip-flops 105 and 110 of FIG. 1), AC characteristics of which are to be measured. Output data of the circuit under measurement is propagated in the loop of the ring oscillator. That is, the system of FIG. 1 includes a clock generating circuit (104, 109 of FIG. 1) and delay adjustment circuit (102, 107 of FIG. 1). The clock generating circuit receive a signal propagated in the loop of the ring oscillator, while generating a clock signal to be supplied to the circuit under measurement. The delay adjustment circuit receives a signal propagated in the loop of the ring oscillator and generates a data signal to be supplied to the corresponding circuit under measurement, while variably controlling the amount of delay of the data signal with respect to the clock signal, based on a control signal (SEL1). In the present invention, the clock generating circuit generates a clock signal to be supplied to the circuit under measurement, responsive to transition of an output signal of a preceding-stage inverter of the circuit under measurement. The delay adjustment circuit (102, 107) receives an output signal of the inverter arranged at a preceding-stage of the circuit under measurement to vary the delay time of the input signal based on the control signal. An output signal of the circuit under measurement is supplied to an input end of an inverter arranged at succeeding-stage of the circuit under measurement.

According to the present invention, a setup hold changeover circuit (103, 108 of FIG. 1) is provided at preceding-stage of the circuit under measurement. The setup-hold changeover circuit switches the temporal before and after relation between a transition edge of the data signal supplied to the circuit under measurement and an effective edge of said clock signal, based on a control signal (SEL2) for performing changeover between the measurements of setup time and hold time.

In the present invention, described above, when the measurement of AC characteristics is performed under the condition wherein the ring oscillator oscillates, the timing difference between the clock edge and data to be supplied to the circuit under measurement (105, 110) is varied, e.g. progressively decreased, by the delay adjustment circuit (102, 107), based on a control signal. Measured values of AC characteristics (setup time/hold time) are derived from the value of the control signal when the oscillation of the ring oscillator comes to a stop.

FIG. 1 shows the configuration of an example of the present invention. More specifically, FIG. 1 shows the overall configuration of a system for measuring AC characteristics of an LSI. Elements shown in FIG. 1 are mounted on an LSI chip, with an input terminal 100 and an output terminal 112 being external pins provided on the LSI. It is noted that such configuration is not meant for restricting the invention. Referring to FIG. 1, the system includes a NAND circuit 101 that has a first input end connected to the input terminal 100, a first ROSC (Ring OSCillator) driving gate 11 and a second ROSC driving gate 12. An output of the second ROSC driving gate 12 is connected to the output terminal 112 and also feedback connected to a second input end of the NAND circuit 101.

The first ROSC driving gate 11 includes a first delay adjustment unit 102, a first setup hold changeover circuit 103, a first clock generating circuit 104, a first flip-flop 105, also termed a D type flip-flop or an edge-triggered register, and a first inverter 106. The first delay adjustment unit 102 receives an output of the NAND circuit 101 and a first selection signal SEL1 to adjust the delay. The first setup hold changeover circuit 103 receives an output signal of the first delay adjustment unit 102 as input and switches between the setup time and hold time in accordance with a second selection signal SEL2. The first clock generating circuit 104 receives an output of the NAND circuit 101 to generate a clock signal. The first flip-flop 105, a data input terminal of which receives an output from the first setup hold changeover circuit 103 and a clock input terminal of which receives an output from the first clock generating circuit 104, samples the data signal responsive to a rising edge of the clock signal. The first inverter 106 inverts an output signal of a data output terminal Q of the first flip-flop 105 to output the so inverted signal.

The second ROSC driving gate 12 includes a second delay adjustment unit 107, a second setup hold changeover circuit 108, a second clock generating circuit 109, a second flip-flop 110, also termed a D type flip-flop or an edge-triggered register, and a second inverter 111. The second delay adjustment unit receives an output of the first inverter 106 of the first ROSC driving gate 11 and the first selection signal SEL1 to adjust the delay. The second setup hold changeover circuit receives an output signal of the second delay adjustment unit 107 as input and switches between the setup time and hold time in accordance with the second selection signal SEL2. The second clock generating circuit receives an output of the first inverter 106 to generate a clock signal. The second flip-flop, a data input terminal of which receives an output from the second setup hold changeover circuit 108 and a clock input terminal of which receives an output from the first clock generating circuit 109, samples the data signal responsive to a rising edge of the clock signal. The second inverter inverts an output signal of a data output terminal Q of the second flip-flop 110 to output the so inverted signal.

An output of the second inverter 111 is connected to an output terminal 112, while being connected to the second input end of the NAND circuit 101. The input terminal 100 is connected to reset terminals RB of the flip-flops 105 and 111, so that, when the input terminal 100 is LOW, the flip-flops 105 and 111 are forced to be reset and data output terminals Q thereof are brought to LOW level. In FIG. 1, an output of the NAND circuit 101, an output of the first setup hold changeover circuit 103, and an output of the first clock generating circuit 104 are represented as Node1, Node 2 and Node 3, respectively. An output of the first flip-flop 105 and an output of the inverter 106 are represented as Node4 and Node5, respectively. An output of the second setup hold changeover circuit 108 and an output of the second clock generating circuit 109 are represented as Node6 and Node7, respectively. An output of the second flip-flop 110 and an output of the second inverter 111 are represented as Node8 and Node9, respectively.

The first delay adjustment unit 102 delays the data signal, entered to the data input terminal D of the flip-flop 105, so that a phase difference will be generated with respect to the clock signal. In similar manner, the second delay adjustment unit 107 delays the data signal, entered to the data input terminal D of the flip-flop 110, so that a phase difference will be generated with respect to the clock signal. The first and second delay adjustment units 102 and 107 are adapted to vary the phase of the data signal with respect to the clock signal, based on the first selection signal SEL1 which is supplied in common to the first and second delay adjustment units 102 and 107.

A ring oscillator, composed by an odd number of inverter stages arranged in a ring, keeps on to be oscillated at the same frequency, as long as the time difference between the edge of the data signal and the effective edge of the clock signal satisfies the setup time of the flip-flops 105 and 110. The odd number of the inverter stages are the NAND circuit 10a, operating as inverter, and the inverters 106 and 111 in FIG. 1. In the present example, the effective edge of the clock signal is an edge effective for sampling, and is here its rising edge. According to the present example, the transition timing of the data signal is changed as from the state of the sustained oscillation, and the time when the condition for the setup time ceases to be satisfied is confirmed by cessation of oscillation of the ring oscillator. That is, as the phase difference between the transition edge of the data signal and the next following effective edge of the clock signal is decreased, such time will come when the flip-flops 105 and 110 cease to correctly sample the input data signal and the output ceases to be inverted. The oscillation of the ring oscillator cease at such time. The phase difference between the edge of the data signal and the effective edge of the clock signal represents the limit value of the setup time.

In the present example, in which there are provided the first and second setup hold changeover circuits 103 and 108 for switching between measurement of the setup time and that of the hold time, measurement of the setup time and that of the hold time may be made in a similar manner. The ring oscillator keeps on to be oscillated at the same frequency as long as the time difference between effective edge of the clock signal and the edge of the data signal satisfies the design condition for the hold time of the flip-flops 105 and 110. The transition timing of the data signal is changed, and the time when the design condition for the hold time ceases to be satisfied is confirmed by cessation of oscillation of the ring oscillator. That is, as the phase difference between the effective edge of the clock signal and the transition edge of data signal, the magnitude of which is maintained even after the effective edge, is decreased, such time will come when the flip-flops 105 and 110 cease to correctly sample the input data signal, and the output ceases to be inverted. The oscillation of the ring oscillator cease at such time. The phase difference between the effective edge of the clock signal and the edge of the data signal represents the limit value of the hold time.

Figure 2:
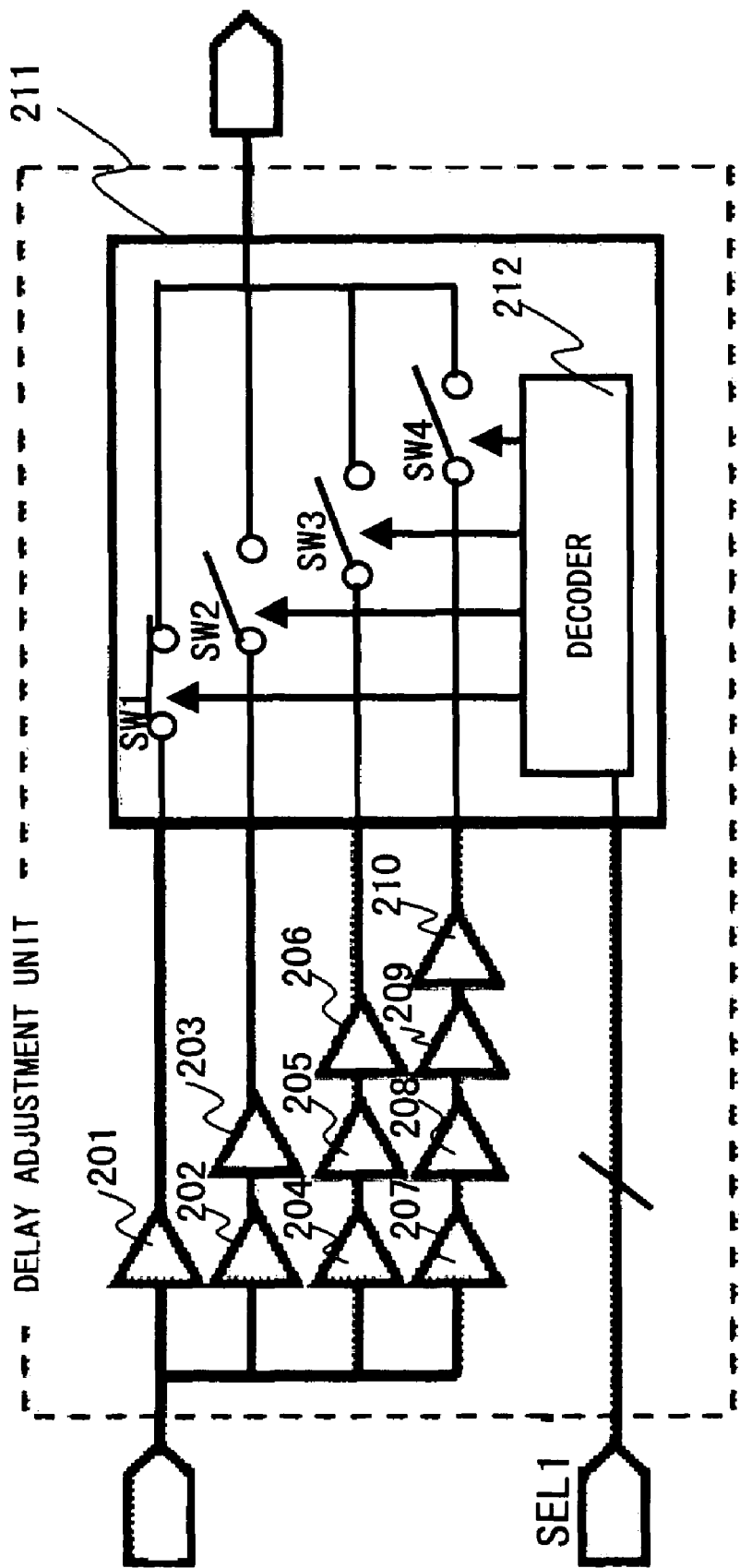
FIG. 2 is a circuit diagram showing the configuration of a delay adjustment unit of an example of the present invention.

FIG. 2 shows an exemplary configuration of the first and second delay adjustment units 102 and 107 of FIG. 1. Meanwhile, the first and second delay adjustment units 102 and 107 are of the same configuration. Referring to FIG. 2, each delay adjustment unit includes first to fourth delay paths, first to fourth switches SW1 to SW4, and a decoder 212. The first delay path delays the input signal by unit delay time by a buffer (unit delay circuit) 201, and the second delay path delays the input signal by two stage buffers 202 and 203. The third delay path delays the input signal by three stage buffers 204 to 206, and the fourth delay path delays the input signal by four stage buffers 207 to 210. The first to fourth switches SW1 to SW4 are connected between the first to fourth delay paths and the output terminal, respectively. The decoder 212 receives and decodes the first selection signal SEL1 to turn on one of the first to fourth switches SW1 to SW4. The first to fourth switches SW1 to SW4 and the decoder 212 make up a selection circuit 211. In the configuration of FIG. 2, the first selection signal SEL1 is a two-bit signal, though not in the restrictive meaning. The first to fourth switches SW1 to SW4 are each formed by a transfer gate, such as an NMOS transistor. Meanwhile, it is sufficient that the first and second delay adjustment units 102 and 107 are able to variably adjust the delay time based on the first selection signal SEL1. Hence, the configuration of the first and second delay adjustment units is not restricted to that shown in FIG. 2. For example, the first and second delay adjustment units may each be provided with a delay circuit string including a plural number of taps with differing delay time, in which one of these taps is selected based on a selection signal.

Figure 3:
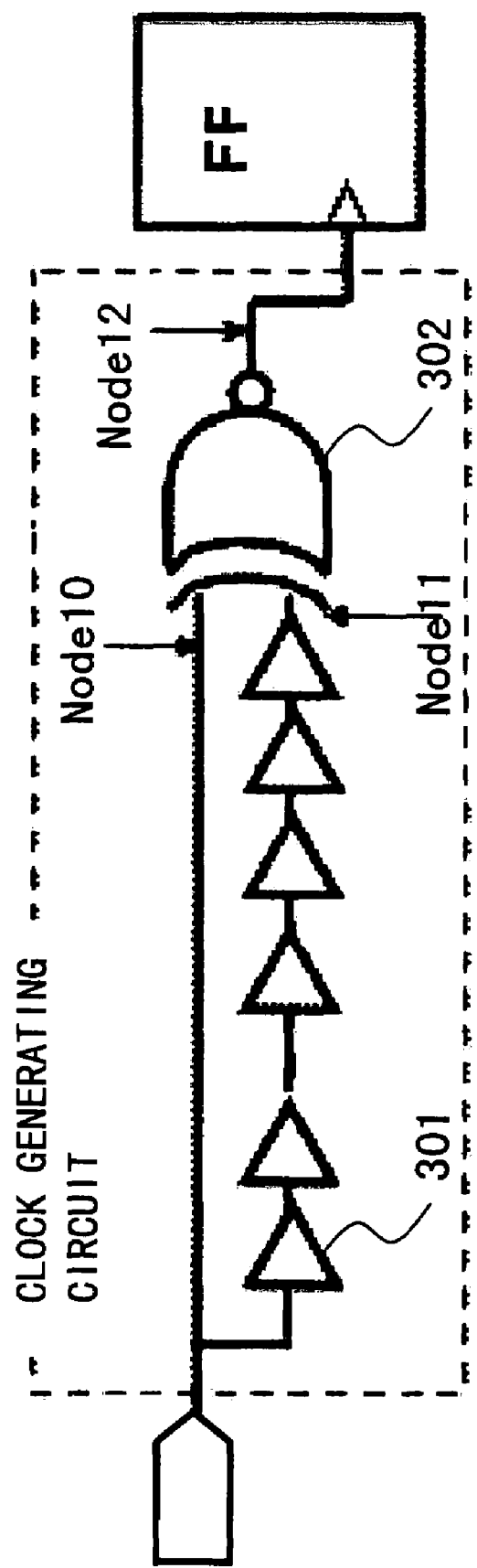
FIG. 3 is a circuit diagram showing the configuration of a clock generating circuit of an example of the present invention.
Figure 7:
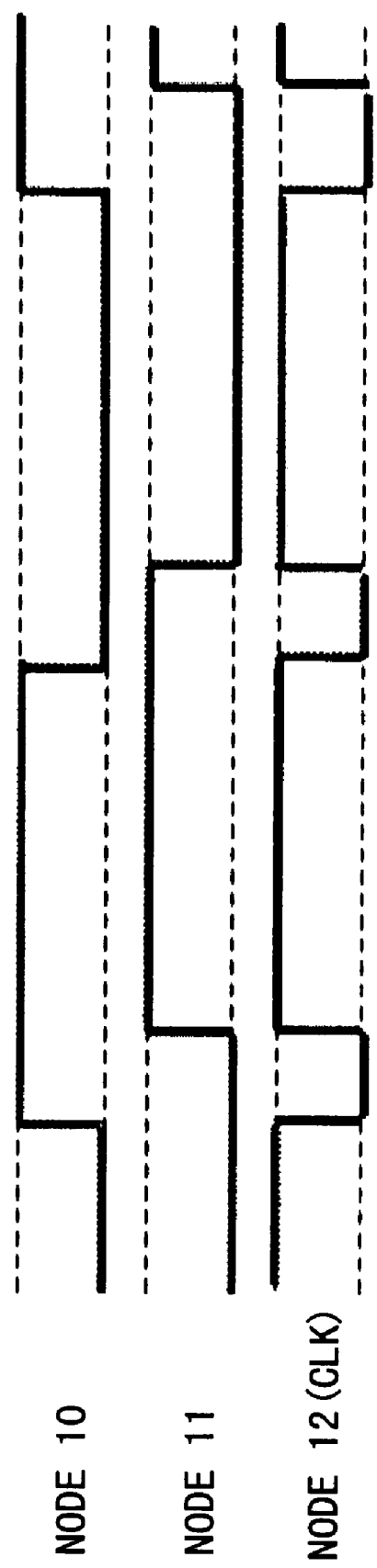
FIG. 7 is a timing chart for the clock generating circuit of an example of the present invention.

FIG. 3 shows an exemplary configuration of the first and second clock generating circuits 104 and 109. Meanwhile, the first and second clock generating circuits 104 and 109 are each of the same configuration. Referring to FIG. 3, each clock generating circuit includes an exclusive NOR (EX-NOR) circuit 302 which receives an input signal at a first input terminal (Node 10) and which receives at its second input terminal (Node 11) a signal delayed from the input signal by plural delay circuit stages 301. FIG. 7 depicts a timing chart for the clock generating circuit of FIG. 3. An output (Node 12) of the EXNOR circuit 302 becomes HIGH in case the logic value of the signal at the output Node10 coincides with that of the signal at the output Node11, while becoming LOW if otherwise. Thus, as shown in FIG. 7, the output Node12 of the EXNOR circuit 302 outputs a clock pulse which goes LOW at the rising and falling transitions of the signal Node10, representing an input signal at the clock generating circuit, and which goes HIGH after lapse of the delay time of the delay circuit stages 301 to remain HIGH until the next transition of the signal Node 10 to go LOW at this next transition of the signal Node 10.

Figure 4:
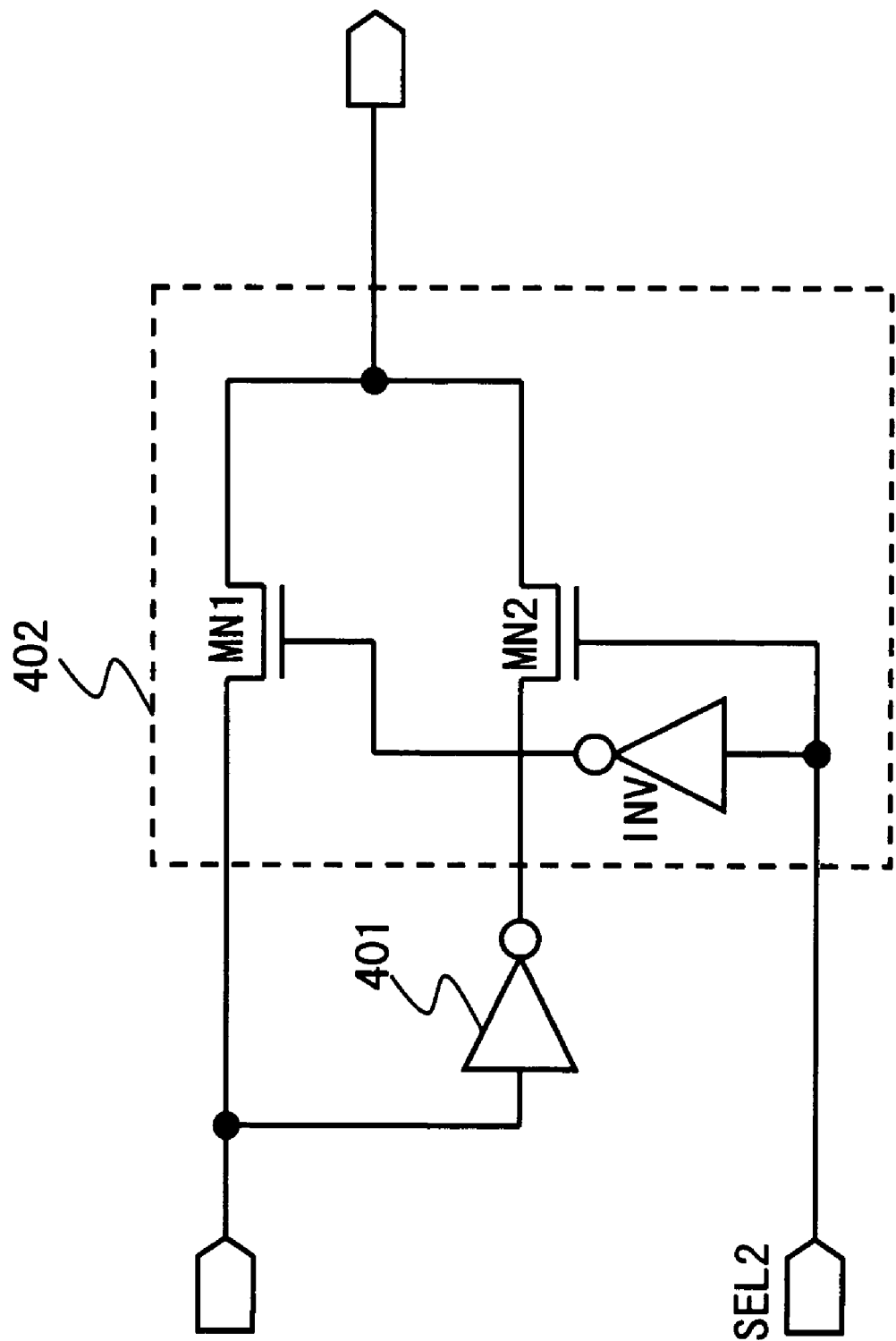
FIG. 4 is a circuit diagram showing the configuration of a setup hold changeover circuit of an example of the present invention.

FIG. 4 shows an exemplary configuration of first and second setup hold changeover circuits 103 and 108 of FIG. 1. These first and second setup hold changeover circuits 103 and 108 are of the same configuration. Referring to FIG. 4, the setup hold changeover circuit includes a selection circuit 402 which receives an input signal (non-inverted signal) and an inverted input signal, which is an output of an inverter 401 supplied with the input signal. The selection circuit selects the inverted signal at the time of measuring the setup time, while selecting the non-inverted signal at the time of measuring the hold time, in accordance with the second selection signal SEL2. The selection circuit then outputs the so selected signals to the nodes Node 2 and Node 6 of FIG. 1. In the example shown in FIG. 4, the second selection signal SEL2 is a 1-bit signal, though not in the restrictive meaning. When the second selection signal SEL2 is HIGH, the second switch (NMOS transistor MN2) is turned on to select the inverted signal. When the second selection signal SEL2 is LOW, the first switch (NMOS transistor MN1) is turned on to select the non-inverted signal. It is noted that, although FIG. 4 shows the configuration of a transfer gate, made up of the NMOS transistors MN1 and MN2, this configuration is not meant to restrict the present invention.

Figure 5:
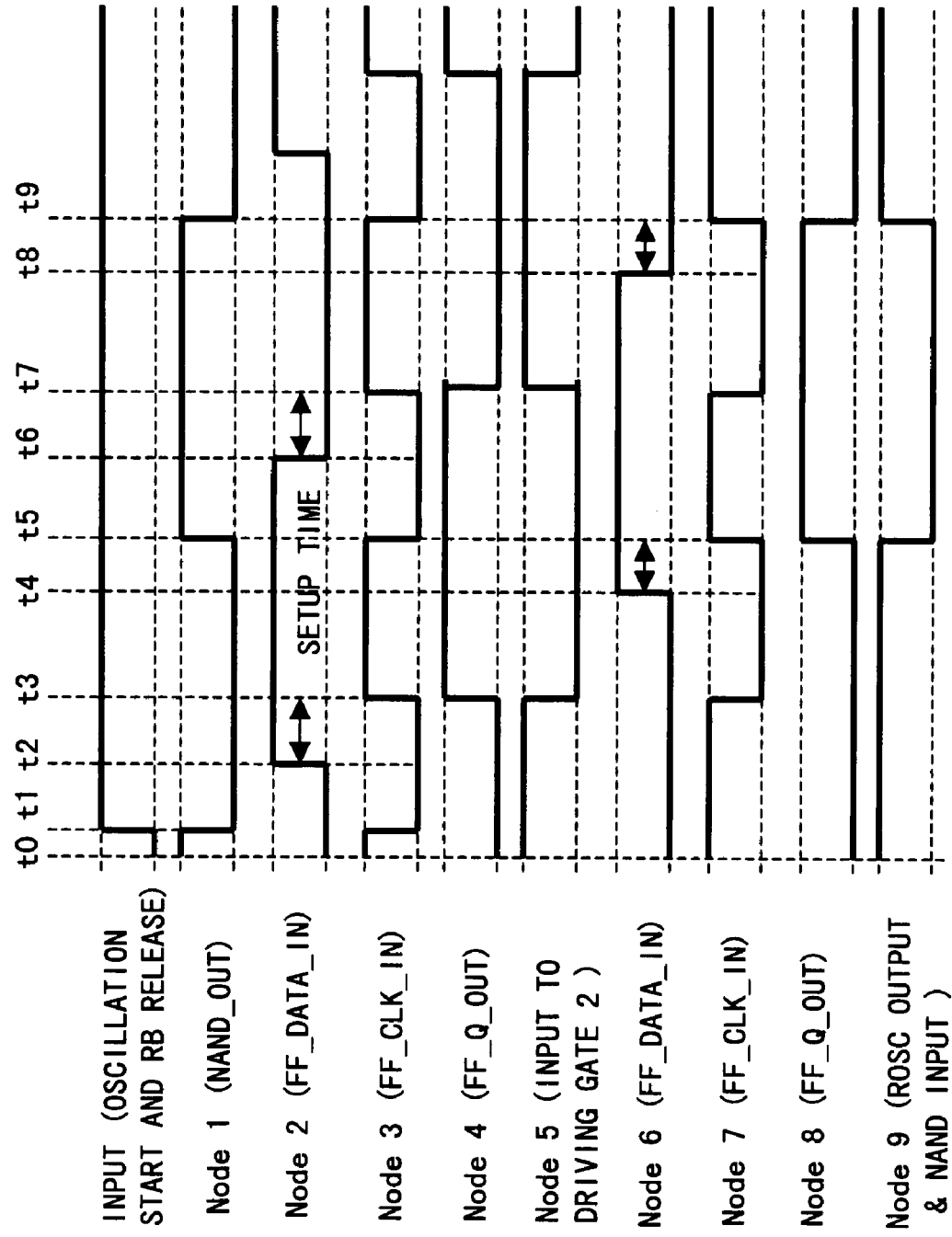
FIG. 5 is a timing chart for the setup time measurement mode of an example of the present invention.

FIG. 5 depicts an operational timing diagram of the present example for a mode of measuring the setup time of the flip-flop. The operation of measuring the setup time of the present example will now be described with reference to FIGS. 1 to 5.

In FIG. 5, the input terminal 100 is at LOW level at timing t0. At this time, the output Node1 (NAND_OUT) of the NAND circuit 101, a first input end of which is connected to the input terminal 100, outputs HIGH without dependency on the logic state of the second input end. The signal at the input terminal 100 is supplied to reset terminals RB of the flip-flops 105 and 110, as reset signals RB (LOW active signals), so that data output terminals Q of the first and second flip-flops 105 and 110 are both reset to LOW level. HIGH level (fixed level), obtained on inverting LOW level, which is an output from the second flip-flop 110, by the inverter 111, is feed-backed to the second input end of the NAND circuit 101. The output Node1 (NAND_OUT) of the NAND circuit 101 remains HIGH.

At a timing t1, the signal at input terminal 100 is set to HIGH level. At this time, the reset states of the first and second flip-flops 105 and 110 are released. Since the output Node9 of the inverter 111, which is an output of the drive gate 12 and is also an input to the NAND circuit 101, is HIGH, the two input ends of the NAND circuit 101 are both HIGH. Thus, at time t1, the output Node1 of the NAND circuit 101 (NAND_OUT) transitions from HIGH to LOW.

At timing t1, a signal at the output node1 of the NAND circuit 101 transitions from HIGH to LOW, and is supplied to the first ROSC driving gate 11. The signal is then delayed by delay time as set in the first delay adjustment unit 102 and inverted by the first setup hold changeover circuit 103. The so inverted signal is then output, at a timing t2, as a signal which rises from LOW level to HIGH level, to the output Node2 (FF_DATA_IN), so as to be supplied to the data input terminal D of the flip-flop 105. The time difference between timings t1 and t2 corresponds to the delay time as set by the first delay adjustment unit 102. The output of the NAND circuit 101 is also supplied to the first clock generating circuit 104. This first clock generating circuit 104 generates a clock pulse which rises at a timing t3 delayed by a preset time from the falling transition edge of an output signal of the NAND circuit 101 and which falls at a rising transition edge of the output signal of the NAND circuit 101 (timing t5). The first flip-flop 105 samples the signal at the data input terminal with the rising edge of the clock signal of the output Node3 (FF_CLK_IN) of the first clock generating circuit 104 to output the so sampled data to the data output terminal Q (Node4).

That is, at timing t2, the data signal at the data input terminal of the first flip-flop 105 becomes HIGH. At timing t3, the clock at the clock input terminal of the first flip-flop 105 rises and the sampled data is output at the data output terminal Q. The timing difference from timing t2 (transition edge of the data signal) until timing t3 (rising edge of the clock signal) corresponds to the setup time of the first flip-flop 105. The timing difference from timing t2 until timing t3 is variably controlled by the first delay adjustment unit 102, as described above.

At a timing t3, the data output terminal Q of the first flip-flop 105 (Node4) transitions from LOW to HIGH. The output of the first inverter 106 (Node5) transitions from HIGH to LOW and is supplied to the second ROSC driving gate 12.

In the second ROSC driving gate 12, the second delay adjustment unit 107 receives a signal at the output Node5 of the first inverter 106, and delays the signal with the first selection signal SEL1 by the delay time equal to that at the first delay adjustment unit 102 to output the so delayed signal to the second setup hold changeover circuit 108. Since the setup time is being measured, the second setup hold changeover circuit 108 routes the inverted signal of the output signal of the second delay adjustment unit 107 to the data input terminal D of the second flip-flop 110 (Node6). The inverted signal is the signal of Node5 delayed and then inverted. The timing difference between the timing t3 corresponding to the falling edge of the signal Node5 and the timing t4 corresponds to the delay time as set by the second delay adjustment unit 107. The second clock generating circuit 109 receives a signal at the output Node5 of the first inverter 106 and supplies a clock signal to a clock input terminal CK of the second flip-flop 110 (Node7). At a timing t4, the data signal (FF_DATA_IN) at the data input terminal D of the second flip-flop 110 (Node6) goes HIGH. At a timing t5, the clock (FF_CLK_IN) of a clock input terminal CK of the second flip-flop 110 (Node7) rises, so that a HIGH level is output at the data output terminal Q (Node8). The signal at the output Node9 of the second inverter 111 transitions from HIGH to LOW, at timing t5, so that the signal at the output Node1 of the NAND circuit 101 goes HIGH. The time difference as from the timing t4 (transition edge of the data signal) until timing t5 (rising edge of the clock signal) corresponds to the setup time of the second flip-flop 110. The time difference as from the timing t4 until timing t5 is variably controlled by the second delay adjustment unit 107, in the same way as described above.

In the first ROSC driving gate 11, the input Node2 to the first flip-flop 105 transitions from HIGH to LOW, at a timing t6, responsive to the transition to HIGH level at a timing t5 of the signal at the output Node1 of the NAND circuit 101. The output Node4 of the first flip-flop 105 (FF_Q_OUT) goes LOW with the rising of the clock signal at timing t7, so that the output Node5 of the first inverter 106 goes HIGH from LOW. The time difference as from the timing t6 (transition edge of the data signal) until timing t7 (rising edge of the clock signal), which is equal to the timing difference between timings t2 and t3, corresponds to the setup time of the first flip-flop 105.

The signal at the output Node5 of the first inverter 106 is delayed by the second delay adjustment unit 107 of the second ROSC driving gate 12 and inverted by the second setup hold changeover circuit 108. The resulting signal (FF_DATA_IN of Node6) goes LOW from HIGH at timing t8. The second flip-flop 110 is responsive to the rising (at a timing t9) of a clock signal, generated with the rising transition of the signal at output Node5 of the first inverter 106, to output the LOW level at the data output terminal Q (FF_Q_OUT of Node8). The time difference as from the timing t8 (transition edge of the data signal) until timing t9 (rising edge of the clock signal), which is equal to the timing difference between timings t4 and t5, corresponds to the setup time of the second flip-flop 110.

Thus, by deriving the signal at the output Node9 of the second inverter 111 of the second ROSC driving gate 12 to outside at the output terminal 112, oscillation may be observed by a measurement unit or a tester.

With the present example in which the data and the clock, supplied to the first and second flip-flops 105 and 110, are generated within the circuit device, it is unnecessary to supply the clock or the data from outside.

It is when the first and second flip-flops 105 and 110 in the first ROSC driving gate 11 and in the second ROSC driving gate 12 satisfy the design conditions for the setup time that oscillation at the output Node9 of the second inverter 111 of the second ROSC driving gate 12 may be observed. In case at least one of the first and second flip-flops 105 and 110 fails to satisfy the design conditions for the setup time, desired logic cannot be output at the flip-flop output. In such case, the signal at the output Node9 is not inverted and oscillation comes to a stop. Meanwhile, the first and second selection signals SEL1 and SEL2 may be control signals supplied from outside. In the case of BITS (Built-In Self Test), enclosed test programs may be run to exercise internal control.

In the present example, the signal at the input terminal 100 is for controlling the oscillation of the ring oscillator and for resetting of the flip-flops, and is given from outside the device.

In the present example, the output Node9 is monitored from the outside terminal to comprehend allowable limit points of the setup time and hold time of the flip-flop, based on the value of the selection signal SEL1 at cessation of oscillation at Node9. Hence, the present example may be used for measuring the setup time of the flip-flop.

Figure 8:
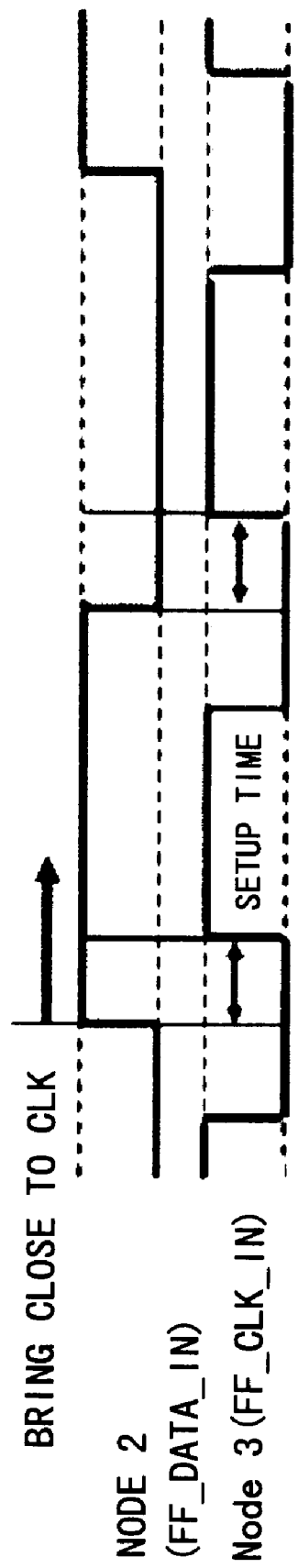
FIG. 8 is a timing chart for illustrating the measurement of the setup time of an example of the present invention.

FIG. 8 depicts a timing chart for illustrating the operational principle for measuring the setup time. If, in the first delay adjustment unit 102, the transition edge of the output Node2 (data input of the flip-flop 105) is brought close to the clock at the output Node3, the setup time progressively ceases to be satisfied. The desired logic cannot be picked up and the logic reversed from the immediately previous logic cannot be returned to the output Node9 of the second inverter 111, so that the oscillation comes to a stop. The setup time can then be grasped based on the delay caused on the route as selected by the data variation section. The limit value of the setup time can be known from the value of the selection signal SEL1 as from the oscillation state until cessation of oscillation.

Figure 6:
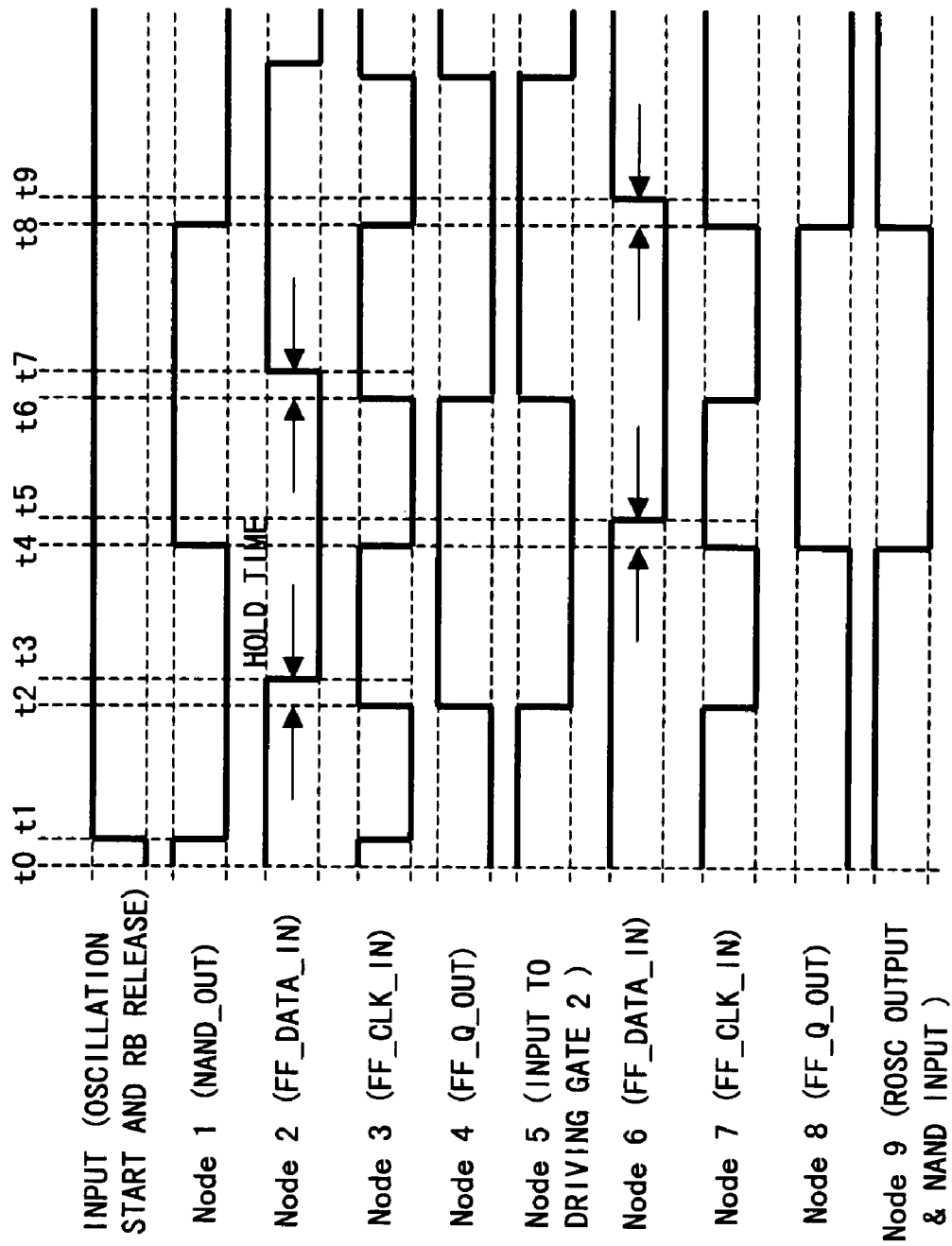
FIG. 6 is a timing chart for the hold time measurement mode of an example of the present invention.

Hold time measurement will now be described. FIG. 6 shows the operational timing during measurement of the hold time.

At a timing t0 of FIG. 6, the input terminal 100 is at LOW level. The output Node1 (NAND_OUT) of the NAND circuit 101, a first input end of which is connected to the input terminal 100, outputs HIGH without regard to the logic value at its second input end. The input terminal 100 supplies the reset signal RB (LOW active signal) to the reset terminals RB of the flip-flops 105 and 110 to reset the data output terminals Q of the first and second flip-flops 105 and 110 to LOW level. HIGH level (fixed level), obtained on inverting LOW level which is an output from the second flip-flop 110, by the inverter 111, is feed-backed to the second input end of the NAND circuit 101. However, the output Node1 of the NAND circuit 101 (NAND_OUT) remains HIGH.

At timing t1, the input terminal 100 is set to HIGH level. At this time, the reset state of the first and second flip-flops 105 and 110 is released. Since the output Node9 of the inverter 110 is HIGH, both the first and second input terminals of the NAND circuit 101 are HIGH. The output Node9 is the ROSC output and is also an input to the NAND circuit. Thus, at the timing t1, the output Node1 (NAND_OUT) of the NAND circuit 101 transitions from HIGH to LOW.

The signal at the output Node1 of the NAND circuit 101, transitioning at timing t1 from HIGH to LOW, is supplied to the first ROSC driving gate 11 and delayed a preset delay time in the first delay adjustment unit 102. A non-inverted signal is selected by the first setup hold changeover circuit 103. Thus, the delayed input signal is output to the output Node2 (FF_DATA_IN) as a signal which falls from HIGH to LOW at a timing t3. The signal then is supplied to the data input terminal D of the flip-flop 105. The time difference between the timings t1 and t3 represents the delay time as set by the first delay adjustment unit 102. The output of the NAND circuit 101 is also supplied to the first clock generating circuit 104. This first clock generating circuit 104 generates a clock pulse which rises at timing t2 delayed a preset time from the falling edge of the output signal of the NAND circuit 101 and which falls at the rising edge of the output signal of the NAND circuit 101 (at timing t4). The first flip-flop 105 samples the signal at the data input terminal with the rising edge of the clock signal at the output Node3 of the first clock generating circuit 104 (FF_CLK_IN) to output the so sampled data to the data output terminal Q (Node4).

That is, the clock at the clock input terminal of the first flip-flop 105 rises at the timing t2 to sample the data signal of the HIGH level at the data input terminal D. The data signal D transitions from HIGH to LOW at timing t3. The time difference between the timing t2 (rising edge of the clock signal) and the timing t3 (transition edge of the data signal) corresponds to the hold time of the first flip-flop 105. The time difference between timing t2 (rising edge of the clock signal) and timing t3 (transition edge of the data signal) corresponds to the hold time of the first flip-flop 105. The time difference between the timing t2 and the timing t3 may be variably controlled by the first delay adjustment unit 102, as described above.

At the timing t2, the data output terminal Q of the first flip-flop 105 (Node 4) transitions from LOW to HIGH. The output of the first inverter 106 (Node5) transitions from HIGH to LOW and is supplied to the second ROSC driving gate 12.

In the second ROSC driving gate 12, the second delay adjustment unit 107 receives the signal at the output Node5 of the first inverter 106, and delays the received signal a delay time equal to the delay time of the first delay adjustment unit 102 by the first selection signal SEL1. The so delayed signal is output to the second setup hold changeover circuit 108. Since the hold time is being measured, the second setup hold changeover circuit 108 supplies a non-inverted signal of the output signal from the second delay adjustment unit 107, that is, a signal obtained on delaying the signal at the output Node5 with the same logic, to the data input terminal D of the second flip-flop 110 (Node6). That is, the signal at Node5, which has fallen at timing t2, is delayed by the second delay adjustment unit 107, and is supplied at timing t5 as a data signal at the data input terminal D of the second flip-flop 110 (Node6). This data signal transitions from LOW to HIGH. The time difference between the timing t2 of the falling edge of the Node5 signal and the timing t5 corresponds to the delay time as set in the second delay adjustment unit 107. The second clock generating circuit 109 receives the signal at the output Node5 of the first inverter 106 to generate a clock signal which rises at timing t4. The signal at the output Node5 transitions from LOW to HIGH at timing t2. The clock signal, rising at the timing t4, is supplied to the clock input terminal Node7 of the second flip-flop 110.

At timing t4, the clock signal (F_CLK_IN) at the clock input terminal CK (Node7) of the second flip-flop 110 rises so that a HIGH level is output from the data output terminal Q of the second flip-flop 110 (Node8). The signal at the output Node9 of the second inverter 111 transitions from HIGH to LOW, at timing t4, so that the signal at the output Node1 of the NAND circuit 101 becomes HIGH. The time difference between the timing t4 (rising edge of the clock signal) and the timing t5 (transition edge of the data signal) corresponds to the setup time of the second flip-flop 110. The time difference as from timing t4 until timing t5 is variably controlled by the second delay adjustment unit 107, in the manner as described above.

In the first ROSC driving gate 11, the first clock generating circuit 104, responsive to transition to the HIGH level of the signal at the output Node1 of the NAND circuit 101 at timing t4, outputs a clock signal which falls at timing t6 (FF_CLK_IN at Node3). That is, the first flip-flop 105 samples the data signal (LOW level) at timing t6, with its data output terminal Q (Node4) becoming LOW. The output Node5 of the first inverter 106 goes HIGH level from LOW.

The input Node2 to the first flip-flop 105, responsive to the transition to the HIGH level of the signal at the output Node1 of the NAND circuit 101 at timing t4, goes HIGH from LOW at timing t7. The time difference as from timing t6 (rising edge of the data signal) until timing t7 (transition edge of the data signal), which is equal to the time difference between the timings t2 and t3, corresponds to the hold time of the first flip-flop 105.

In the second ROSC driving gate 12, receiving the signal at the output Node5 of the first inverter 106, the second clock generating circuit 109 outputs a clock signal (FF_CLK_IN at Node7) which rises at a timing t8. The signal delayed by the second delay adjustment unit 107 and output via second setup hold changeover circuit 108 (FF_DATA_IN at Node6) goes HIGH from LOW at timing t9. The second flip-flop 110, responsive to rising (at timing t8) of the clock signal, generated by the second clock generating circuit 109, based on rising transition of the signal at the output Node5 of the first inverter 106, outputs LOW level (FF_Q_OUT at Node8). The output of the second inverter 111 transitions from LOW to HIGH at timing t8. The time difference as from timing t8 (rising edge of the clock signal) until timing t9 (transition edge of the data signal), which is equal to the time difference between the timings t4 and t5, corresponds to the hold time of the second flip-flop 110.

Thus, by deriving the output Node9 to outside, oscillation may likewise be observed in the case of measuring the hold time. The hold time may be grasped by delay caused on the route as selected by the control signal SEL1 by the delay adjustment units 102 and 107.

Figure 9:
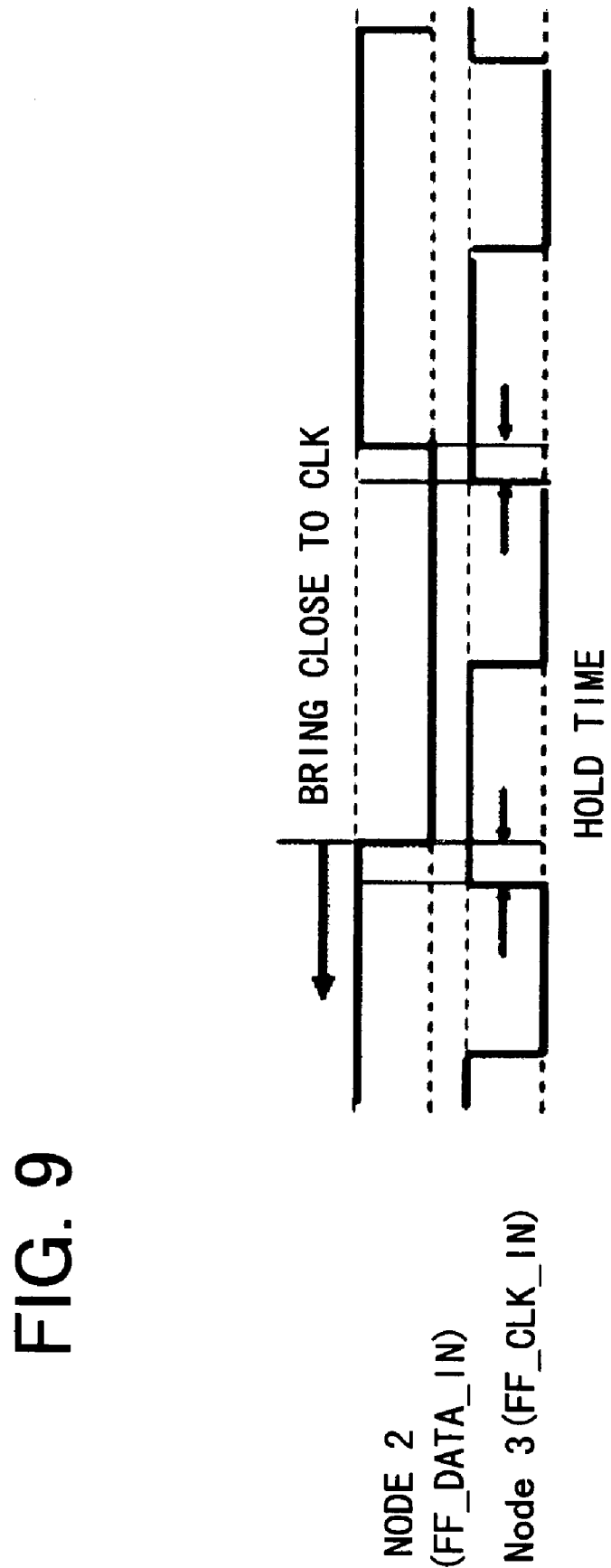
FIG. 9 is a timing chart for illustrating the measurement of the hold time of an example of the present invention.

FIG. 9 depicts a timing chart for illustrating the operational principle for measuring the hold time. If, in the first and second delay adjustment units 102 and 107, the transition edge of the output Node2 (data input of the flip-flop 105) is brought close to the clock at the output Node3, the hold time progressively ceases to be satisfied. The desired logic cannot be picked up or sampled and the logic reversed from the immediately previous logic cannot be returned to the output Node9 of the second inverter 111. Hence, the oscillation comes to a stop. The hold time can then be grasped based on the delay caused on the route selected by the data variation section.

In the conventional technique, it is necessary to provide a clock supply means outside of the LSI being measured, and also to provide a pulse generator for repeatedly generating pulses of preset widths in synchronization with the clock. With the ring oscillator configuration according to the present invention, it is possible to autonomously generate the clock and the pulses for measurement.

If the design condition for the setup time is met, the ring oscillator continues to be oscillated. If conversely the design condition for the setup time is not met, the oscillation of the ring oscillator is brought to a stop. The timing of cessation of the oscillation of the ring oscillator may be observed as indicating the setup time.

With the ring oscillator configuration, the clock and the pulses for measurement may autonomously be generated to measure the setup time and hold time without the necessity of supplying the clock from outside. Moreover, since the setup time and hold time may be verified by cessation of oscillation of the ring oscillator, measurement may be facilitated to advantage.

With the above example, the test circuit for the setup time and hold time of the flip-flop is of a one-chip configuration. However, the present invention is not limited to the on-chip configuration such that separate chips, such as TEG (Test Element Group) chips, may also be used.

In the above example, the odd number stage inverters, constituting the ring oscillator, are of the three-stage configuration which is made up of the inverters 106, 111 and the NAND circuit 101. The NAND circuit 101 operates as an inverter in which, when the HIGH level is supplied to its first input terminal, an input to its second input terminal is inverted and output. The present invention is not limited to the three-stage configuration. In the above example, the non-inverted data output terminal of each flip-flops 105, 111 is connected to the circuit within the loop of the ring oscillator. Alternatively, the inverted data output terminal of each flip-flop 105, 111 may be connected to the circuit within the loop of the ring oscillator, in which case the flip-flop may operate as an inverter. Of course, the number of the flip-flops, the setup time and hold time of which are to be measured, is not limited to two.

Although the present invention has so far been described with reference to preferred examples, the present invention is not to be restricted to the examples. It is to be appreciated that those skilled in the art can change or modify the examples without departing from the scope and spirit of the invention.

It should be noted that other objects, features and aspects of the present invention will become apparent in the entire disclosure and that modifications may be done without departing the gist and scope of the present invention as disclosed herein and claimed as appended herewith.

Also it should be noted that any combination of the disclosed and/or claimed elements, matters and/or items may fall under the modifications aforementioned.

What is claimed is:

1. An AC characteristics measurement system comprising:
   a ring oscillator that includes odd number of stages of inverters arranged in a ring;
   a circuit under measurement that samples an input signal responsive to a clock signal, AC characteristics of which are to be measured, said circuit under measurement being inserted in a loop of said ring oscillator;
   a clock generating circuit that receives a signal propagated in said loop of said ring oscillator and generates a clock signal to be supplied to said circuit under measurement; and
   a delay adjustment circuit that receives a signal propagated in said loop of said ring oscillator and generates said input signal to be supplied to said circuit under measurement, said delay adjustment circuit receiving a control signal and variably controlling the delay amount of said input signal supplied to said circuit under measurement, based on said control signal.

2. The system according to claim 1, wherein
   said clock generating circuit generates the clock signal to be supplied to said circuit under measurement, responsive to transition of the output signal of the inverter arranged at the preceding stage of said circuit under measurement; and
   said delay adjustment circuit receives an output signal of the inverter at a preceding stage of said circuit under measurement and varies the delay time of said input signal based on said control signal;
   an output signal of said circuit under measurement being supplied to an input end of the inverter at a succeeding stage of said circuit under measurement.

3. The system according to claim 1, wherein
   said clock generating circuit and said delay adjustment circuit are provided on a chip on which said circuit under measurement is provided.

4. The system according to claim 1, wherein the setup time and/or the hold time of said circuit under measurement are derived from the value of said control signal at a time point when the oscillation at a preset node of said ring oscillator stops.

5. An AC characteristics measurement system comprising:
   a ring oscillator that includes odd number of stages of inverters arranged in a ring;
   a flip-flop inserted in a loop of said ring oscillator;
   a clock generating circuit that receives a signal propagated in said loop of said ring oscillator and generates a clock signal to be supplied to said flip-flop; and a delay adjustment circuit that receives a signal propagated in said loop of said ring oscillator and generates a data signal to be supplied to said flip-flop, said delay adjustment circuit receiving a control signal and variably controlling the time difference between a transition edge of said data signal to be supplied to said flip-flop and an effective edge of said clock signal to be supplied to said flip-flop, based on said control signal.

6. The system according to claim 5, wherein
the setup time and/or the hold time of said flip-flop is derived from the value of said control signal at a time point when the oscillation at a preset node of said ring oscillator stops.

7. The system according to claim 5, wherein
said clock generating circuit generates said clock signal to be supplied to said flip-flop responsive to transition of an output signal of the inverter at a preceding stage of said flip-flop; and
said delay adjustment circuit receives an output signal of said inverter arranged at a preceding stage of said flip-flop and varies the delay time of said data signal based on said control signal;
an output signal of said flip-flop being supplied to an input end of the inverter arranged at a succeeding stage of said flip-flop.

8. The system according to claim 5, further comprising:
a setup-hold changeover circuit that is provided at a preceding stage of said flip-flop and that switches the temporal before and after relation between a transition edge of said data signal supplied to said flip-flop and an effective edge of said clock signal, responsive to a control signal for performing changeover between the measurements of setup time and hold time.

9. The system according to claim 5, wherein
a circuit that generates an oscillation control signal for controlling the start of oscillation of said ring oscillator is provided in said loop of said ring oscillator;
said flip-flop is reset by a reset signal supplied from outside to reset oscillation of said ring oscillator; and wherein
said ring oscillator restarts oscillation when said oscillation control signal is set to a value indicating oscillation.

10. A semiconductor integrated circuit device wherein said system as set forth in claim 5 is provided on a chip on which said flip-flop is provided.

11. A semiconductor integrated circuit device wherein said system as set forth in claim 5 is provided on a chip different than a chip on which said flip-flop is provided.

12. A method for measuring a semiconductor device comprising:
arranging a flip-flop, AC characteristics of which are to be measured, in a loop of a ring oscillator composed by an odd number of stages of inverters connected in a ring, said method comprising the steps of:
supplying to said flip-flop a data signal and a clock signal generated from a signal propagated in said loop; and
variably controlling, based on a control signal, the time difference between a transition edge of said data signal to be supplied to said flip-flop and an effective edge of said clock signal to be supplied to said flip-flop;
a measured value of AC characteristics being derived from a value of said control signal at a time point of cessation of oscillation of a preset node of said loop.

13. The method according to claim 12, wherein said AC characteristics are a setup time and/or a hold time of said flip-flop.

* * * * *